(12) United States Patent
Fazendin et al.

(10) Patent No.: US 12,730,461 B1
(45) Date of Patent: Sep. 8, 2026

(54) LOW VOLTAGE LEVEL CONTROLLERS

(71) Applicants: Erin Fazendin, Big Piney, WY (US); Brian Meador, Marbleton, WY (US)

(72) Inventors: Erin Fazendin, Big Piney, WY (US); Brian Meador, Marbleton, WY (US)

(73) Assignee: Fazor LLC, Big Piney, WY (US)

( * ) Notice: Subject to any disclaimer, the term of this patent is extended or adjusted under 35 U.S.C. 154(b) by 692 days.

(21) Appl. No.: 18/186,891

(22) Filed: Mar. 20, 2023

Related U.S. Application Data

(60) Provisional application No. 63/321,289, filed on Mar. 18, 2022.

(51) Int. Cl.
*G05D 9/12* (2006.01)
*H03K 17/945* (2006.01)

(52) U.S. Cl.
CPC ............ *G05D 9/12* (2013.01); *H03K 17/945* (2013.01)

(58) Field of Classification Search
None
See application file for complete search history.

(56) References Cited

U.S. PATENT DOCUMENTS

2006/0086389 A1* 4/2006 Erickson ............... F02D 33/003 137/255
2016/0008742 A1* 1/2016 Adler ...................... G01F 15/08 700/282
2022/0049653 A1* 2/2022 Bollinger .................. F02C 6/14

* cited by examiner

*Primary Examiner* — Stephanie E Bloss
*Assistant Examiner* — Diana Hancock
(74) *Attorney, Agent, or Firm* — Miller IP; Devin Miller

(57) ABSTRACT

Described herein are examples of devices which include low voltage level controllers having a sensor head and a control box. The sensor head includes a proximity switch that is positioned within a first aperture of the sensor head. The sensor head includes a second aperture that is removably attachable to a vessel. The control box is located remotely to the sensor head. The control box is configured to operate a dump valve of the vessel, with the dump valve being located remotely to the control box.

14 Claims, 17 Drawing Sheets

LOW VOLTAGE LEVEL CONTROLLERS

CROSS-REFERENCE TO RELATED APPLICATIONS

The present application claims the benefit of U.S. Provisional Patent Application No. 63/321,289 entitled "Low Voltage Level Controllers", filed on Mar. 18, 2022. The entire contents of the above-listed application are hereby incorporated by reference for all purposes.

BACKGROUND

Various liquids or gases are used for a variety of applications and must be provided safely and reliably. Often, liquids or gases are supplied through piping, such as for water or natural gas. In many cases, the gas or liquid is pressurized so that a relatively higher rate of flow is achievable. Various types of valves or controllers may be used to limit, start, or stop flow. Level controllers in particular may be used in a variety of applications to start, stop, increase, or decrease flow through a pipe or valve.

BRIEF DESCRIPTION OF THE DRAWINGS

The present description will be understood more fully when viewed in conjunction with the accompanying drawings of various examples of low-voltage level controllers. The description is not meant to limit the low voltage level controllers to the specific examples. Rather, the specific examples depicted and described are provided for explanation and understanding of the low voltage level controllers. Throughout the description, the drawings may be referred to as drawings, figures, and/or FIGS. Further, any dimensions depicted are for exemplary purposes only and are non-limiting. It will be understood by a person of ordinary skill in the art that the low voltage level controllers disclosed herein may be larger or small, or differently shaped, without departing from the scope of this disclosure.

DETAILED DESCRIPTION

Figure 1:
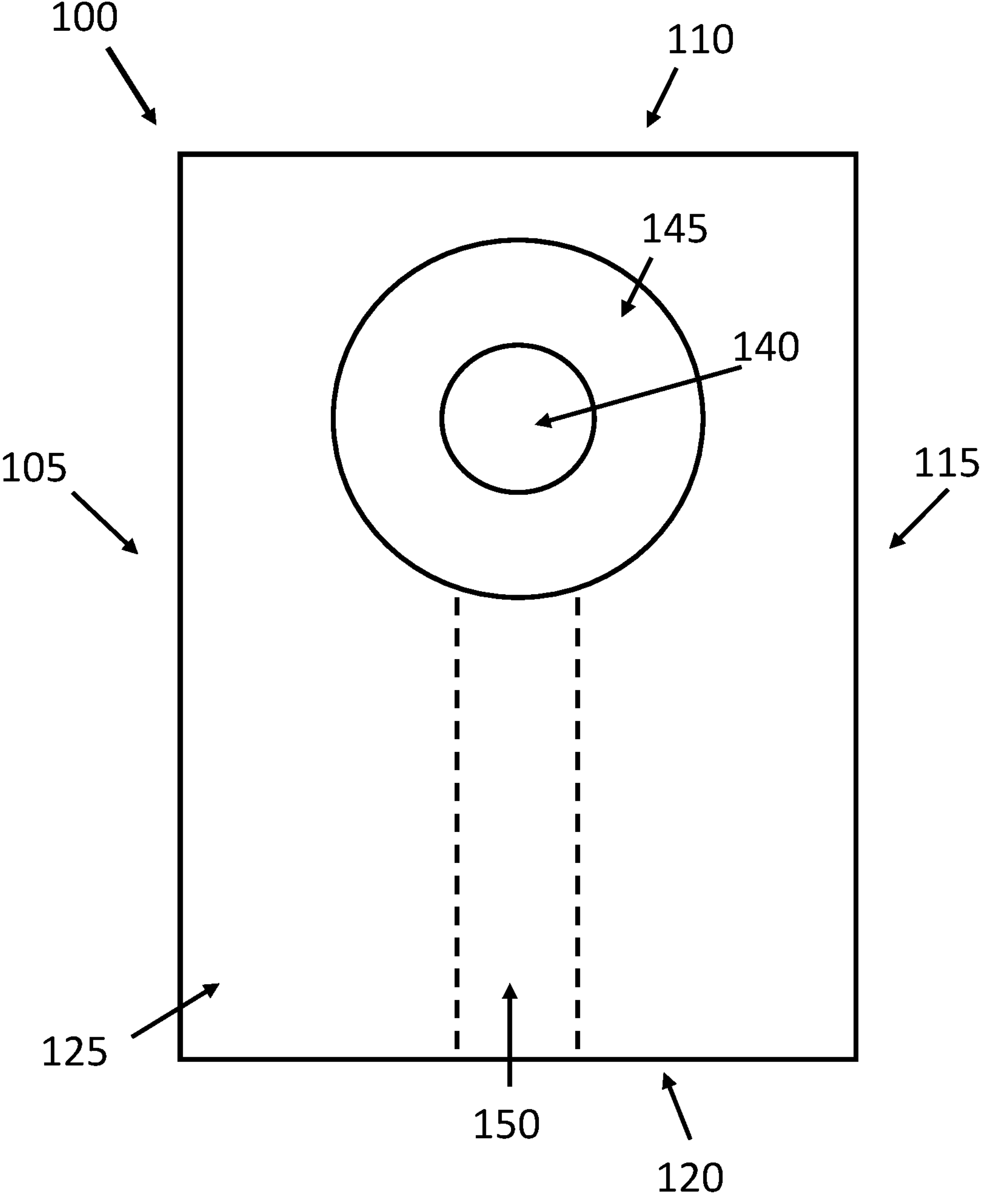
FIG. 1 illustrates a front-side view of a low-voltage sensor head, according to an embodiment.

Low voltage level controllers as disclosed herein will become better understood through a review of the following detailed description in conjunction with the figures. The detailed description and figures provide merely examples of the various embodiments of low voltage level controllers. Many variations are contemplated for different applications and design considerations; however, for the sake of brevity and clarity, all the contemplated variations may not be individually described in the following detailed description. Those skilled in the art will understand how the disclosed examples may be varied, modified, and altered and not depart in substance from the scope of the examples described herein. Further, the terms "fluid," "liquid," or "gas," may be used at times interchangeably herein. It will be understood by persons of ordinary skill in the art that the controller disclosed herein may be used whether gas or liquid levels are being controlled. It will be understood that references to gas flow or level may apply also to liquid flow or level, and vice versa.

In some applications, a controller consists of a switch, a float system, and a control head, which may be referred to as a snaphead, that control flow using a torque tube. One example of a traditional controller is the pneumatic controller and float system manufactured by Wellmark. Controllers may have a variety of features. For various applications, it may be preferred that a valve be selectively sealable and able to be biased open, closed, or in a position that is partially open or partially closed such that the rate of flow matches a predetermined value. A valve may also be testable—that is, able to be checked for whether the valve is open or closed. It may also be preferred that the valve have a low rate of leakage or failure and that the valve have a low cost of production and replacement. In some applications, there are also EPA regulations for divisions or classes of fire or electric safety.

A conventional level controller may include a control head and a switch. Traditionally, control heads are attached to a torque tube and a float system which may control the bias of a valve, to start, stop, or limit the flow of a liquid or gas. Traditional controllers use a pneumatic operation to position the switch and limit flow.

Such pneumatically-operated switches are prone to leakage and failure. Because some pressure is required for the pneumatic switch to operate, some amount of leakage or bleeding is expected. Further, pneumatic switches are expensive to produce and replace and have a high rate of failure or inadequate performance. Some controllers have non-pneumatically operated switches that are electrically powered. However, such controllers are traditionally high-voltage, on the order of about 120 Volts or greater. Such high-voltage controllers may pose fire and electric safety risks may fail to meet EPA regulations for particular safety divisions or classes and are therefore unsuitable for a wide range of applications.

Implementations of the low voltage level controller disclosed herein may address some or all of the problems described above. A low-voltage level controller may include a sensor head, an electric proximity switch, a switching mechanism, a solenoid, and an electric power source. In particular, the electric power source may be a solar power source, such as a solar panel or a battery charged by a solar panel. Power to the solenoid may be supplied by the power source and regulated by the switching mechanism in response to signals from the switch.

Controllers as disclosed herein may be suitable for use with traditional solenoid valves. When the electric proximity switch detects that a change in flow is needed, it changes the amount of power supplied to the solenoid by the power supply. In response to the change in power being supplied to the solenoid, the solenoid will restrict or increase fuel gas supply to a valve to which the controller is attached.

By eliminating the pneumatic operation of the traditional switch of a level controller, the low voltage level controller disclosed herein reduces or eliminates leakage or bleed and failure of the level controller. Further, powering the controller using a solar energy source allows for improved portability and versatility. The controller may be powered by a battery and solar panel. The sensor head and control box may be spaced apart, allowing for fuel gas to be exclusively vented at a location remote to the sensor head. Also, the low voltage level of about 12 Volts decreases fire and electric safety hazards which allows the level controller to have broader application, such as by meeting EPA regulations for electric and fire safety divisions and classes.

The low voltage level controllers of the present invention, therefore, reduce or eliminate bleed, leakage, and failure, have increased versatility, and meet a broader range of EPA regulations by eliminating the pneumatic operation of a traditional switch and by utilizing a low voltage power source that incorporates solar power.

Low voltage level controllers according to embodiments disclosed herein include a sensor head, a control box, and a power source. The sensor head includes an electric proximity switch in an electrical connection with the control box. The control box includes the solenoid, one or more gas intake/outtake lines connected to the solenoid, and a switching mechanism that activates the solenoid in response to a signal from the proximity switch. In some embodiments, the control box also includes a battery in electrical communication with an external solar panel. The sensor head may attach to a traditional torque tube to replace a pneumatic controller.

In operation, changes in the level of gas or liquid in the vessel whose level is being controlled cause the deflection of a torque tube shaft or sensing rod. The proximity switch detects the deflection of the torque tube shaft and supplies a proportional amount of power to the control box. The signal is received by the switching mechanism of the control box, which operates the solenoid. The solenoid controls the position of the dump valve to supply or vent fuel gas. For example, the switch may detect when the fluid level in a vessel reaches a certain point and signal the solenoid to allow fuel gas to open the dump valve. When the level reaches another point, the solenoid may close allowing the fuel gas used to open the dump valve to vent and close the dump valve. The venting may occur at the control box, remote to the torque tube, and attached sensor head.

FIG. 1 illustrates a front view of a low voltage controller sensor head 100, according to an embodiment. The sensor head attaches to a pipe or torque tube and facilitates control of a dump valve based on the movement of the pipe or torque tube in response to liquid levels in a production vessel.

The sensor head 100 includes a first side 105, a second side 110, a top 115, a bottom 120, a front 125, and a back 130. A first aperture 140 extends through the front 125 and the back 130. A connection location 145 may be located proximate to the first aperture 140. A second aperture 150 extends from the bottom 120 to the first aperture 140.

The first aperture 140 and the second aperture 150 may be cylindrically shaped. The first aperture 140 may include threads for screwing onto a pipe, tube, torque tube, or torque tube shaft assembly. The connection location 145 may circumscribe the first aperture 140 to allow for the reception of a torque tube and/or torque tube shaft. The second aperture 150 may be suitably shaped (such as cylindrical and threaded) for receiving a proximity switch which may removably be positionable to extend through the second aperture 150 at least partially into the connection location 145. The apertures 140 and 150, may be suitably shaped such that an electric proximity switch may be installed into the second aperture to detect changes or deflection of a torque tube located in the first aperture 140 (via changes or deflection of a torque tube shaft or sensing rod) when the sensor head 100 is installed.

Figure 2:
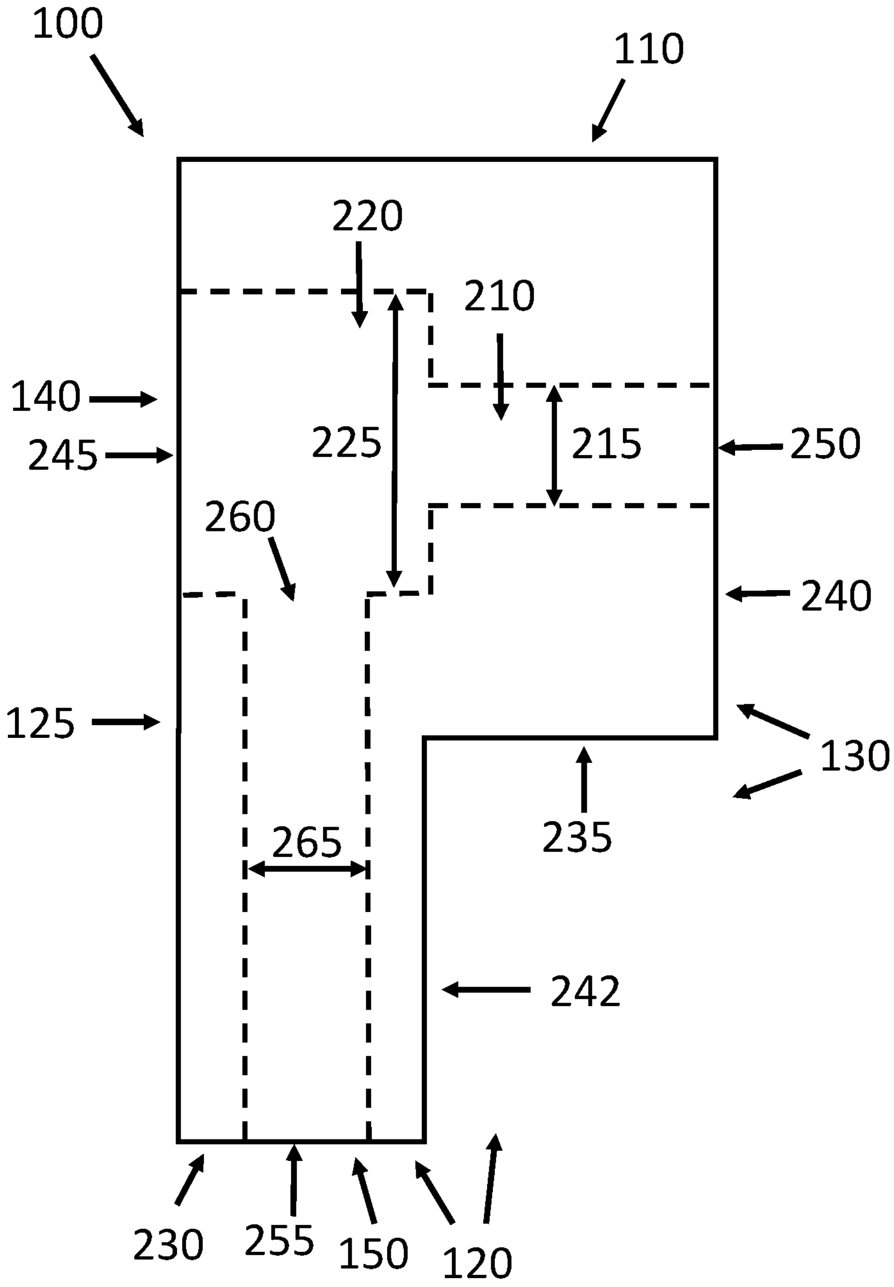
FIG. 2 illustrates a cross-sectional side view of a low-voltage sensor head, according to an embodiment.

FIG. 2 illustrates a cross-sectional first-side view of a low voltage sensor head 100, according to an embodiment. As shown, the first aperture 140 may include a first portion 210 having a first diameter 215, and a second portion 220 having a second diameter 225. In an exemplary embodiment, the diameter 215 of the first portion 210 is 0.5" and the diameter 225 of the second portion 220 is 1.5". The bottom 120 may include a first, front bottom portion 230, and a second, back bottom portion 235. The back 130 may include a first, top portion 240, and a second, bottom portion 242. As shown, the first aperture 140 may include a first end 245 in the front 125 and a second end 250 in the top back portion 240 and extends from the first end 245 to the second end 250. The second aperture 150 includes a first end 255 in the front bottom portion 230 and a second end 260 in a side of the first aperture 140 and extends from the first end 255 to the second end 260. The second aperture 150 has a diameter 265; in an exemplary embodiment, the diameter 265 is 0.5". A switch may be received in the second aperture 150 by being inserted into the first end 255 of the aperture 150. The switch may extend at least partially into the first aperture 140. The switch may be an electric proximity switch. As described further below, the power source for the switch may be remote.

Figure 3:
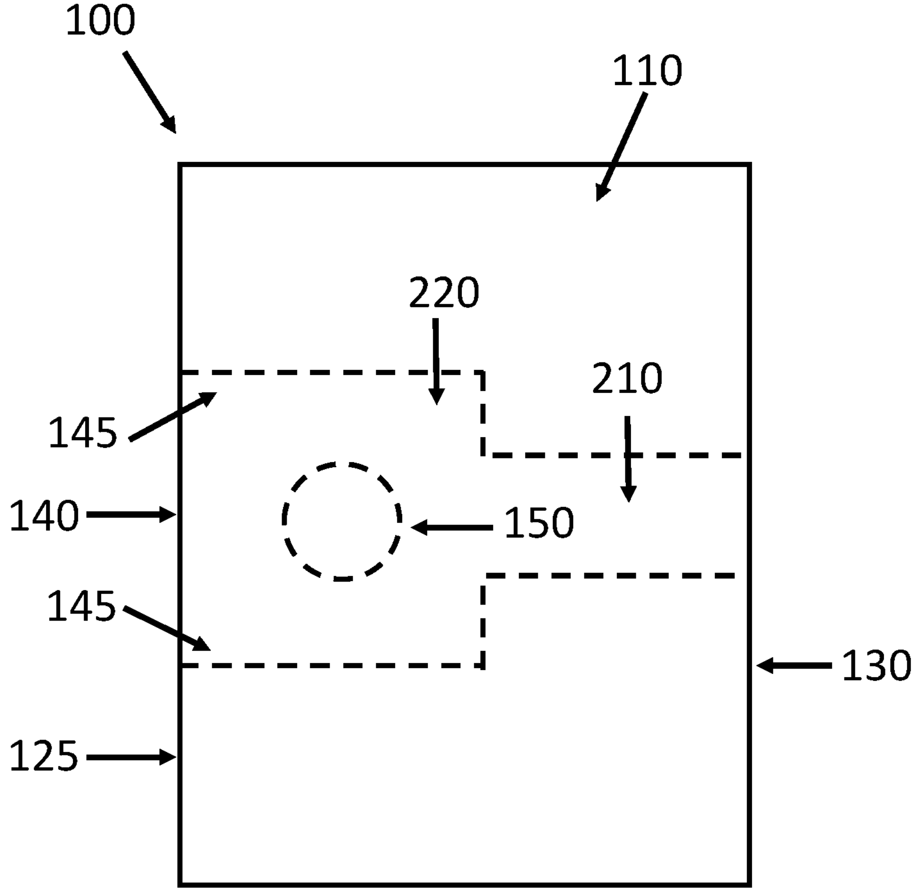
FIG. 3 illustrates a cross-sectional top-side view of a low-voltage sensor head, according to an embodiment.

FIG. 3 illustrates a cross-sectional top-side view of a low voltage sensor head 100, according to an embodiment. This cross-sectional top-side view shows the aperture 140 extending from the front 125 to the back 130, and the connection location 145. In the shown embodiment, the connection location 145 is displayed as having a cylindrical shape. In an alternative embodiment, connection location 145 may have a conical shape, in which the sides of connection location 145 progressively flare from the opening at the end of section 210/start of section 220 of the aperture 140 to the front 125 of the sensor head 100.

Figure 4:
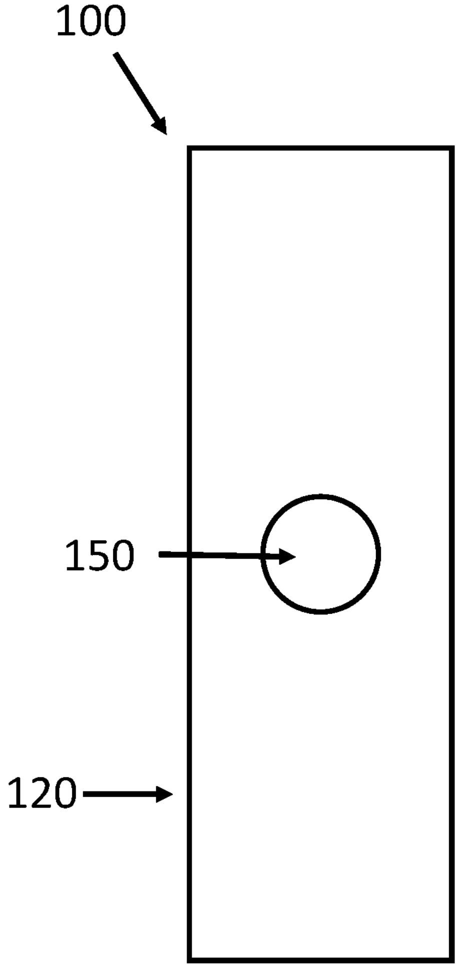
FIG. 4 illustrates a bottom-side view of a lower portion of a low-voltage sensor head, according to an embodiment.

FIG. 4 illustrates a bottom view of a lower portion of a low voltage sensor head 100, according to an embodiment. As shown, the bottom 120 of the sensor head 100 has the second aperture 150 located proximate to the center of the bottom 120 and extending therethrough.

Figure 5:
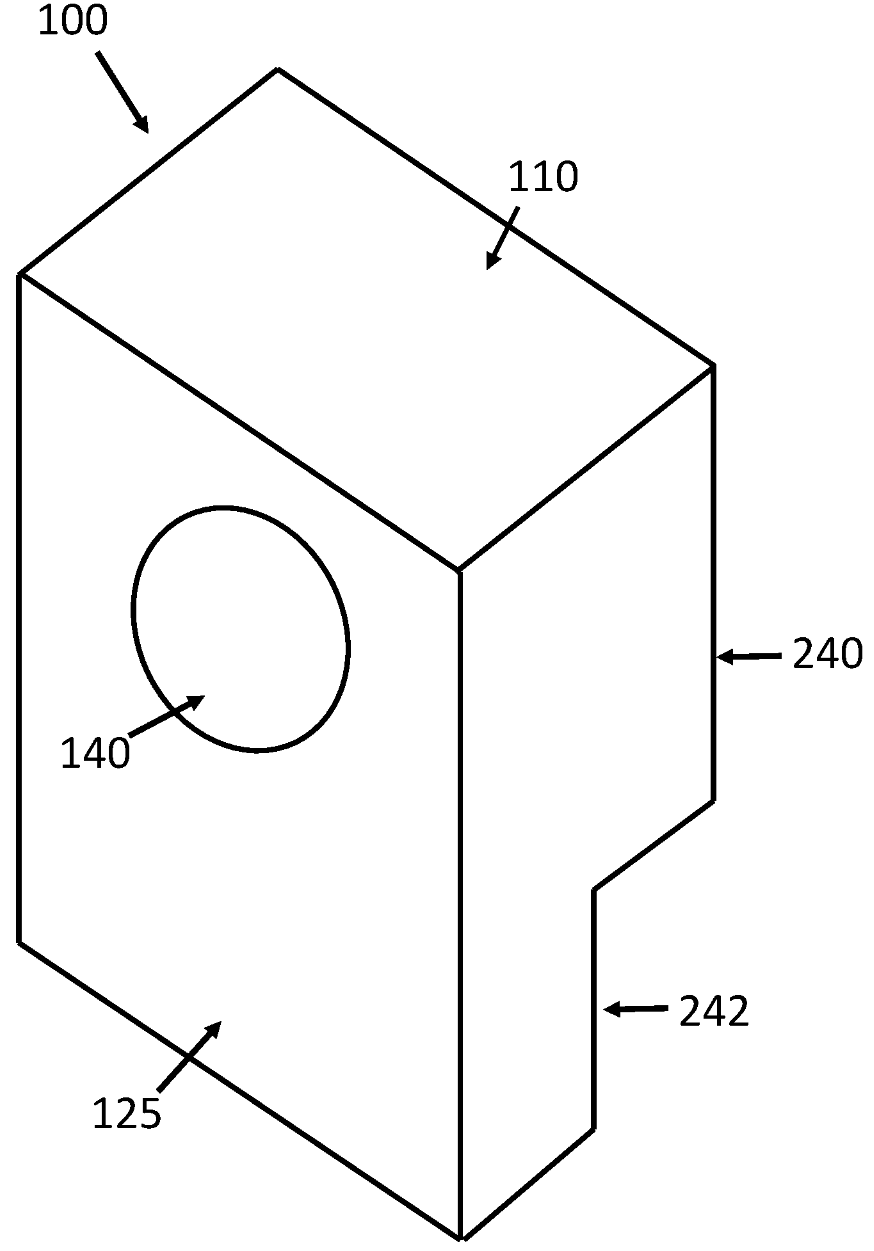
FIG. 5 illustrates a perspective view of a low-voltage sensor head, according to an embodiment.

FIG. 5 illustrates a perspective view of a low-voltage sensor head, according to an embodiment. As shown, the sensor head 100 includes front face 125 which includes aperture 140. This perspective view displays the top 110, and a side of the sensor head 100 that shows the different thicknesses of the portions of the sensor head 100 defined by the length from the front of the sensor head (125) to the back portions 240 (upper portion of the sensor head 100) and 242 (lower portion of the sensor head 100) (as shown in FIG. 2).

Figure 6:
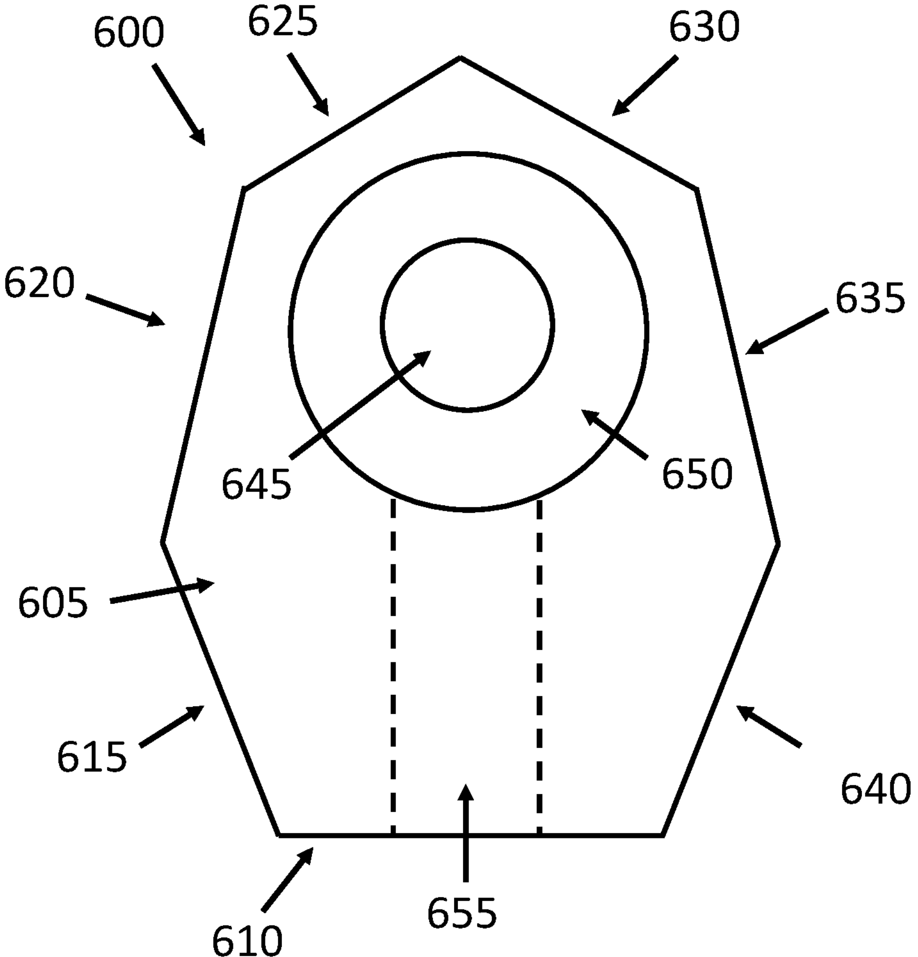
FIG. 6 illustrates a front-side view of a low-voltage sensor head, according to an embodiment.

FIG. 6 illustrates a front, cross-sectional view of a low voltage sensor head, according to an embodiment. The sensor head 600 attaches to a pipe or torque tube and facilitates control of a dump valve based on the movement of the pipe or torque tube in response to liquid levels in a production vessel.

The sensor head 600 includes a front side 605, a bottom 610, four angled sides 615, 620, 635, and 640, and two angled top edges 625 and 630. The seven-sided heptagon shape of the front portion of the sensor head 600 provides for a compact design that is also aesthetically pleasing. The top half of the sensor head 600 includes an aperture 645 that extends from the front 605 through to the rear of the sensor head 600. The rear portion of the aperture 645 is cylindrically shaped to be attached to a torque tube shaft or pipe and may include threads for screwing the sensor head 600 onto a torque tube shaft or pipe. A connection location 650 may be located proximate to the first aperture 645, and preferably has a conical shape that allows access to a torque tube shaft or sensor rod that will extend into the connection location 650.

A second aperture 655 extends from the bottom 610 of the sensor head 600 to the connection location 650 of the first aperture 645. The second aperture 655 may be suitably shaped (such as cylindrical and threaded) for receiving a proximity switch which may removably be positionable to extend through the second aperture 655 at least partially into the connection location 650. The connection location 650 may circumscribe the first aperture 645 to allow for the reception of a torque tube and/or torque tube shaft that may in turn be detected by a proximity switch that protrudes from aperture 655. Accordingly, the apertures 645 and 655, may be suitably shaped such that an electric proximity switch may be installed into the second aperture to detect changes or deflection of a torque tube located in the first aperture 645 (via changes or deflection of a torque tube shaft or sensing rod) when the sensor head 600 is installed.

Figure 7:
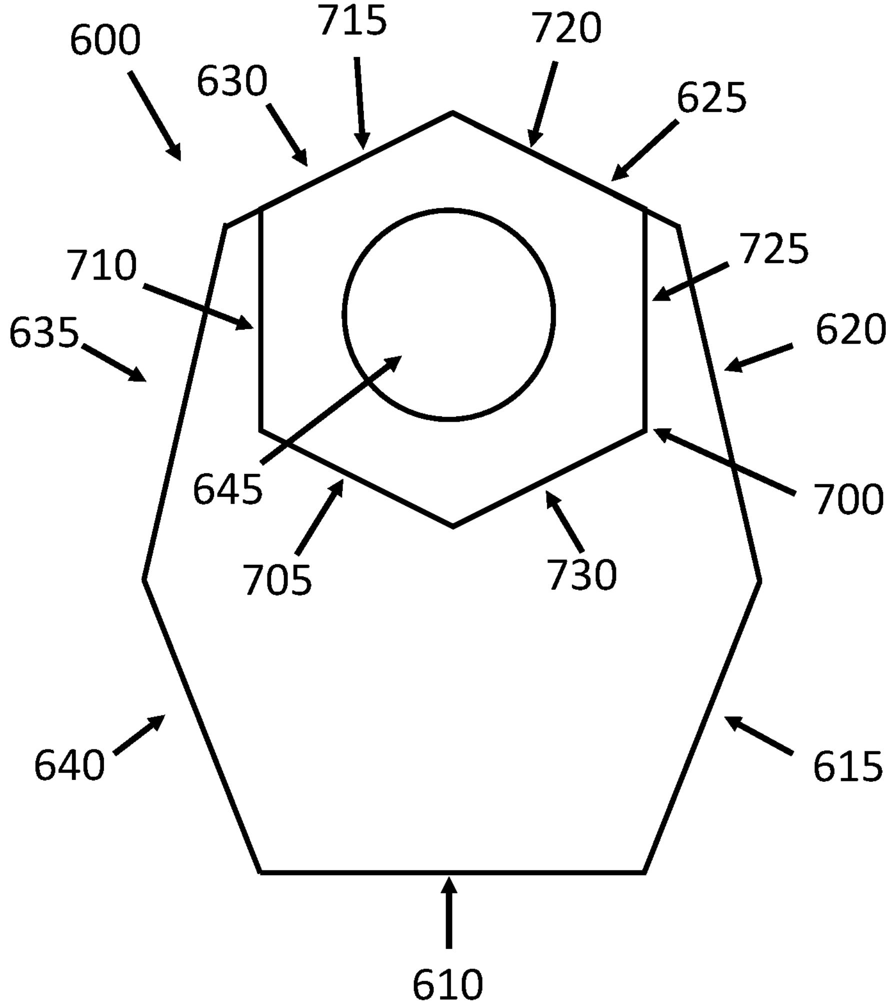
FIG. 7 illustrates a backside view of a low-voltage sensor head, according to an embodiment.

FIG. 7 illustrates a back view of a low-voltage sensor head, according to an embodiment. The back side of the sensor head 600 includes a projection 700 that projects out from the front portion of the sensor head 600 to the rear and contains the rear portion of the aperture 645. The rear portion of the aperture 645 is shaped to be installed onto a torque tube or pipe; thereby, the rear portion of the aperture 645 is preferably cylindrically shaped and threaded.

The exterior of the rear projection 700 of the sensor head 600 is preferably hexagonally shaped as shown in FIG. 7, with the six sides 705, 710, 715, 720, 725, and 730. This preferred hexagonal shape facilitates the installation or removal of the sensor head 600 through the use of an open-ended wrench or similar tool/device that can readily grasp the rear projection 700 and be used to screw the sensor head 600 on or off of a torque tube or pipe.

Figure 8:
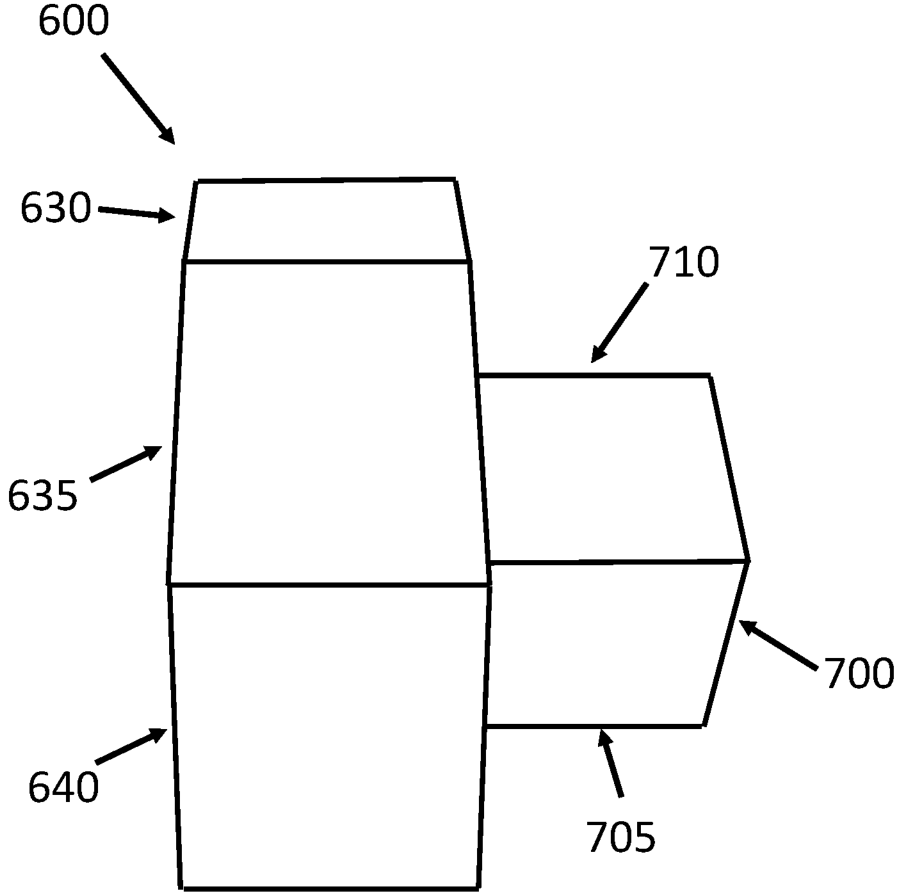
FIG. 8 illustrates a side view of a low-voltage sensor head, according to an embodiment.

FIG. 8 illustrates a perspective side view of a low voltage sensor head, according to an embodiment. In this side view, two sides 705 and 710 of the rear projection hexagon 700 of the sensor head 600 are visible, and three sides 630, 635, and 640 of the front portion heptagon of the sensor head 600 are visible.

As indicated above, the polygonal sensor head shown in FIGS. 6-8 has a compact, easy-to-use, and install size. In a preferred embodiment, the front and rear portions of the sensor head 600 have a depth of 1" (i.e., the depth of each of the shown sides 630, 635, 640, 705, and 710 in FIG. 8 are 1" as measured from front to rear). In that same preferred embodiment, the distance between the heptagonal points defined between sides 615, 620 and sides 635, 640 (FIG. 6) is 2.75"; the diameter of the opening of connection location 650 (FIG. 6) is 1.25"; and the height of the sensor head as measured from the bottom 610 to the top point between sides 625, 630 (FIG. 6) is 2.75". Furthermore, the diameters of the cylindrical, threaded portions of apertures 640 and 655 (FIG. 6) are 0.5". These dimensions are non-limiting dimensions of a preferred embodiment; other dimensions as appropriate for a given application also fall within the scope of the disclosed sensor head.

Figure 9:
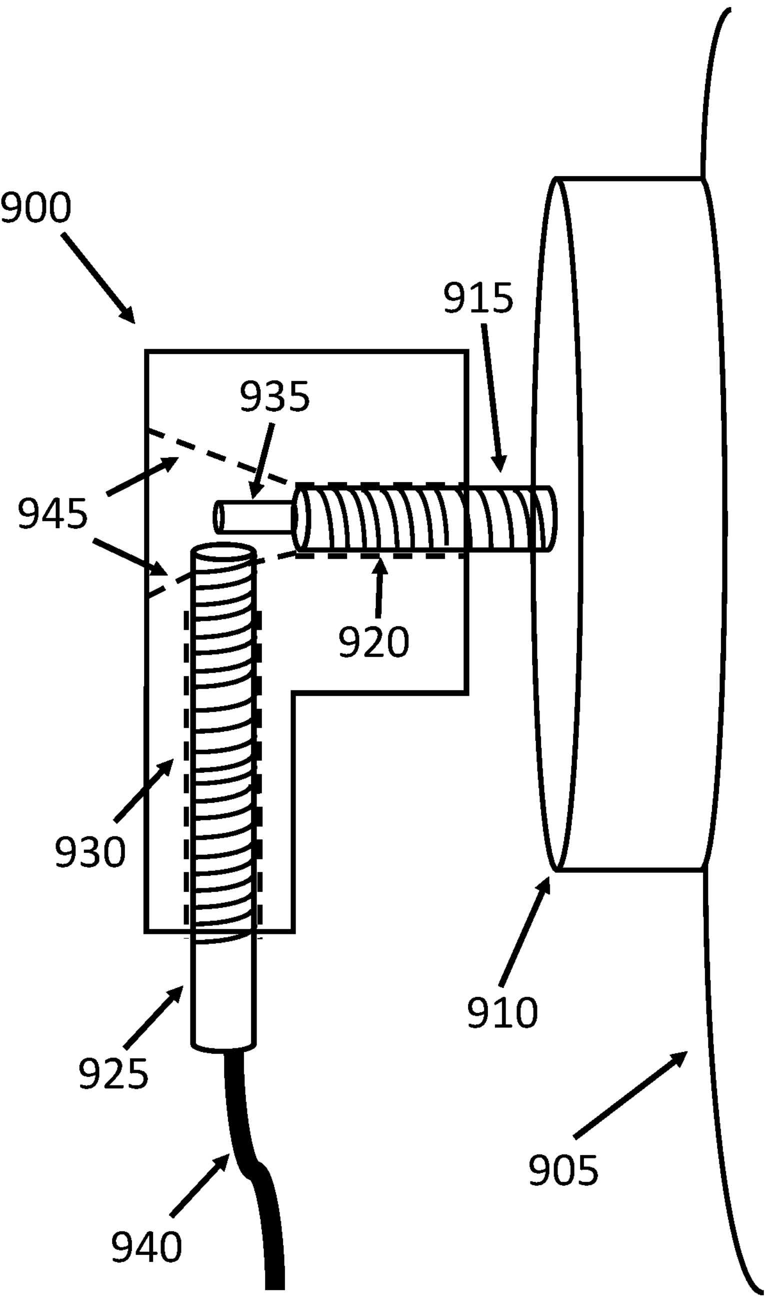
FIG. 9 illustrates a cross-sectional side view of a low-voltage sensor head installed on a production vessel, according to an embodiment.

FIG. 9 illustrates a cross-sectional side view of a low-voltage sensor head according to an embodiment. The low voltage sensor head 900 is shown installed on a liquid-containing production vessel 905. In particular, the low voltage sensor head 900 is attached to a torque tube 915 that extends out of a cylindrical protrusion 910 of the production vessel 905.

The sensor head 900 as shown in FIG. 9 is attached to the torque tube 915 by its threaded cylindrical aperture 920, such that the sensor head 900 is installed by screwing the sensor head onto the torque tube 915.

The sensor head 900 shown in FIG. 9 contains a proximity switch 925 that has been inserted into threaded cylindrical aperture 930. The proximity switch will typically be installed into the sensor head 900 after the sensor head 900 has been installed onto the torque tube 915. The top end of the proximity or sensing switch will detect deflection of the torque tube shaft or sensing rod 935 upon its activation in response to a high liquid level in production vessel 905, as further described below. As shown, the proximity switch 925 has a wire 940 that connects to a control box and transmits a signal from the proximity switch 925 to the control box, as further described below. In an alternative embodiment, a wireless proximity switch can be used in the system to transmit a signal to the control box.

The proximity switch 925 is positioned to detect deflection of the torque tube shaft/sensing rod 935 in a connection location 945 that circumscribes the front portion of the aperture that runs from the front side through the rear side of the sensor head 900. The connection location 945 as shown in FIG. 9 has a preferred conical shape that provides access space around the end of the torque tube shaft 935. Alternatively, connection location 945 may have a cylindrical or another shape that likewise allows access space around the end of the torque tube shaft 935.

Figure 10:
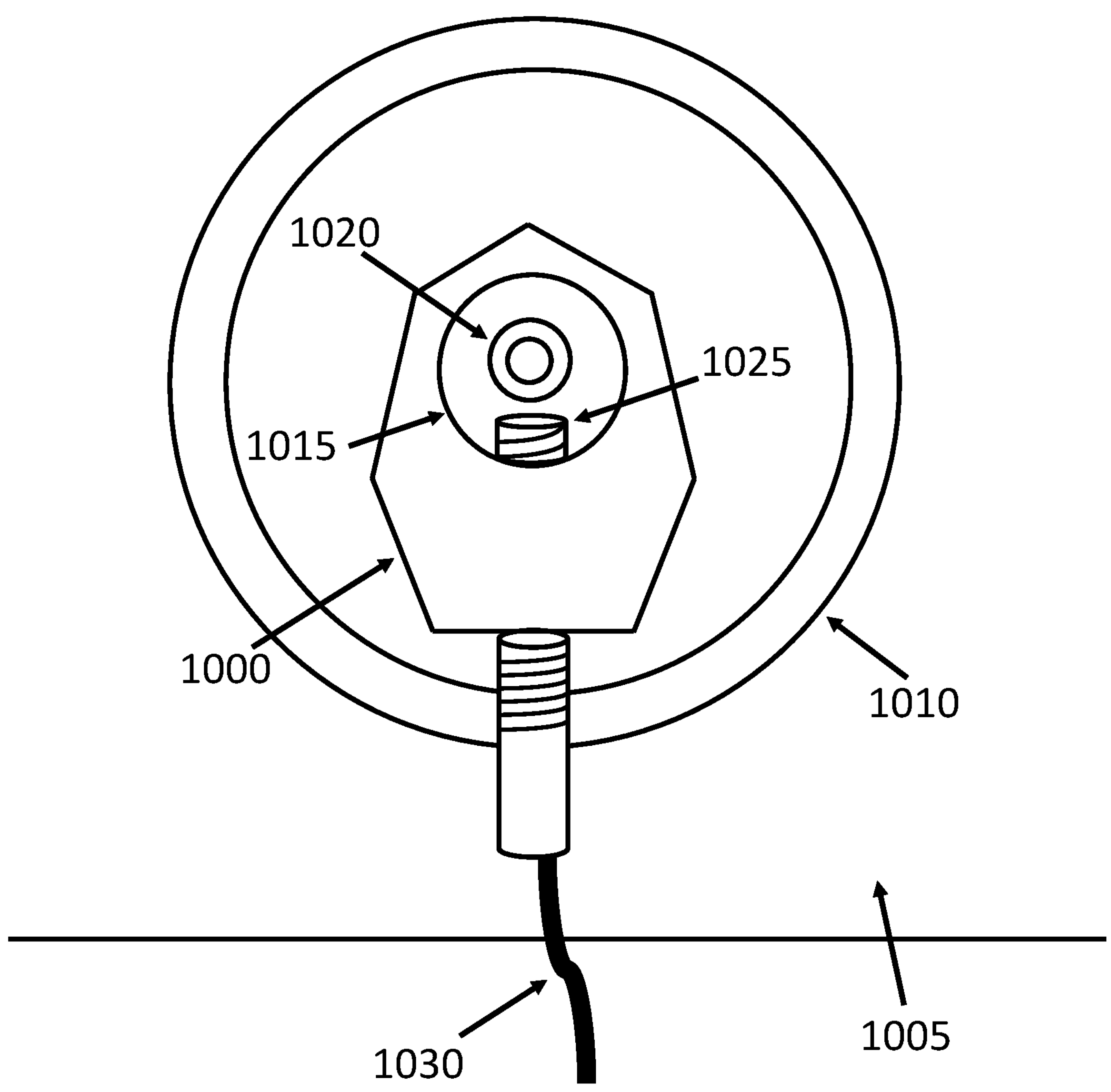
FIG. 10 illustrates a front view of a low-voltage sensor head installed on a production vessel, according to an embodiment.

FIG. 10 illustrates a front view of a low-voltage sensor head, according to an embodiment. The low voltage sensor head 1000 is attached to a torque tube that extends out of a cylindrical protrusion 1010 of a liquid-containing production vessel 1005.

The low voltage sensor head 1000 is attached to a torque tube via a cylindrical, threaded aperture that extends back from the front of the sensor head 1000 toward the production vessel 1005 (similar to the configuration shown above for the sensor head in FIG. 9). The front portion of that aperture is circumscribed by a connection location 1015, in which resides the deflection end 1020 of a torque tube shaft or sensing rod and the detecting end of a proximity or sensing switch 1025. The proximity switch 1025 is inserted into a cylindrical, threaded aperture that extends from the bottom of the sensor head 1000 to connection location 1015. The proximity switch 1025 detects deflection of the end 1020 of the torque tube shaft and transmits a signal via the wire 1030 of the proximity switch, which is in communication with a control box as described below. Alternatively, a wireless proximity switch may be used in the system.

Figure 11:
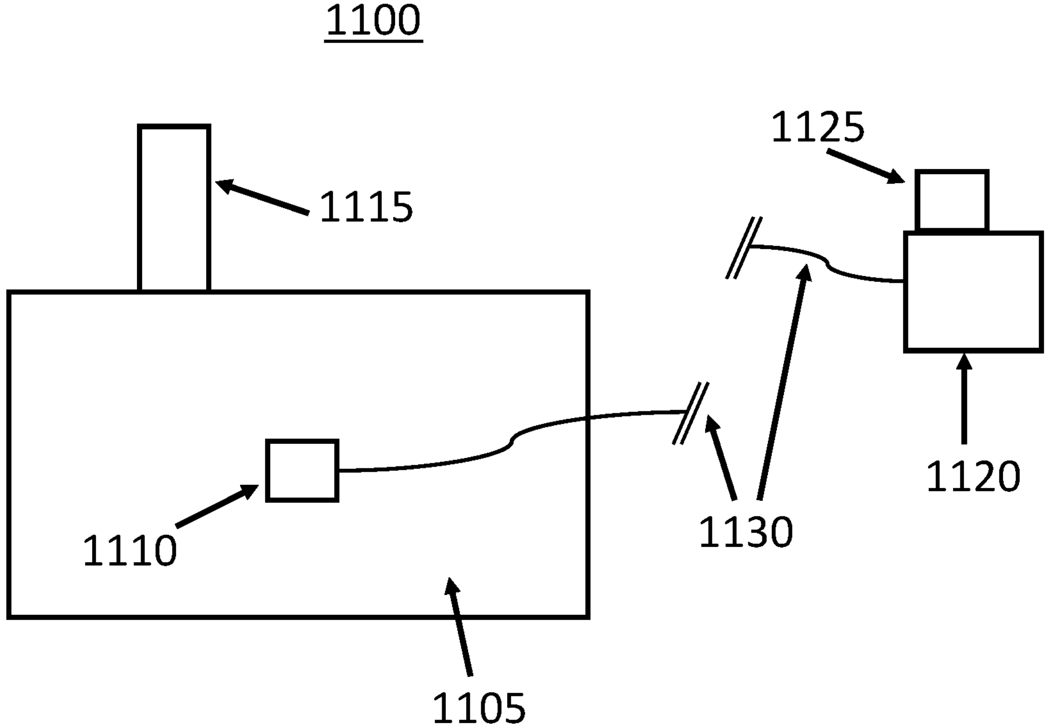
FIG. 11 illustrates a schematic diagram of a system utilizing a low-voltage level controller according to an embodiment.

FIG. 11 illustrates a schematic diagram of a system using a low voltage level controller, according to an embodiment. In general, the system 1100 includes a production vessel 1105, a sensor head 1110, a dump valve 1115, a control box 1120, and a power source 1125. The sensor head 1110 may be attached to a torque tube or torque tube assembly of vessel 1105 to control the level of a liquid or gas in the vessel and/or to control the operation of the dump valve 1115. The sensor head 1110 may be in electrical communication with the control box 1120 via, for example, electrical wiring 1130. The control box 1120 may include a solenoid that operates the dump valve 1115 in response to an electrical signal from a proximity or sensing switch located in the sensor head 1110 as previously described. A power source 1125, such as a solar panel, may provide power to the proximity switch in the sensor head 1110 and control box 1120 directly or may charge a battery that powers the proximity switch in the sensor head 1110 and control box 1120. The sensor head 1110 and control box 1120 may be spaced apart, allowing for ventilation of fuel gas supplied to the dump valve to occur remotely to the sensor head 1110 or vessel 1105.

Figure 12:
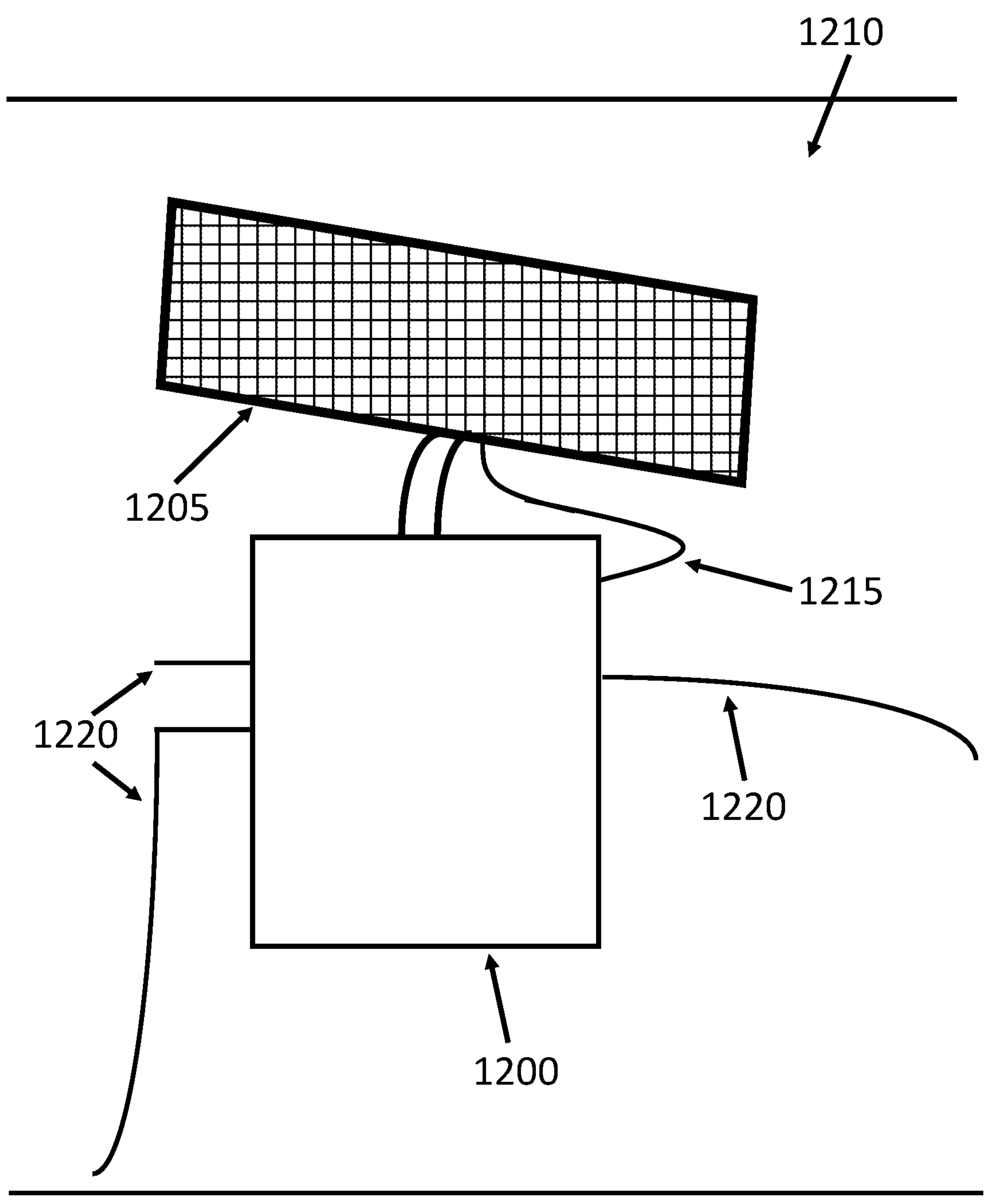
FIG. 12 illustrates a front view of a control box and solar panel, according to an embodiment.

FIG. 12 illustrates a control box of a low voltage level controller and solar panel providing power to the controller according to an embodiment. The control box 1200 according to some embodiments is in electrical connection with a sensor head proximity switch and a solar panel 1205. The control box 1200 and solar panel 1205 are mounted on an upright surface, such as an exterior wall 1210. The control box houses components which operate a dump valve of the production vessel in response to signals from a proximity switch contained in the sensor head, which is attached to the vessel to control the level of fluid or gas inside the vessel. The solar panel 1205 may be sufficient to power the controller, such as by charging a battery housed inside the control box 1200 via the wire 1215 from the solar panel 1205 to the battery. As described below, control box 1200 has various gas/fuel lines 1220 that enter and exit the control box.

Figure 13:
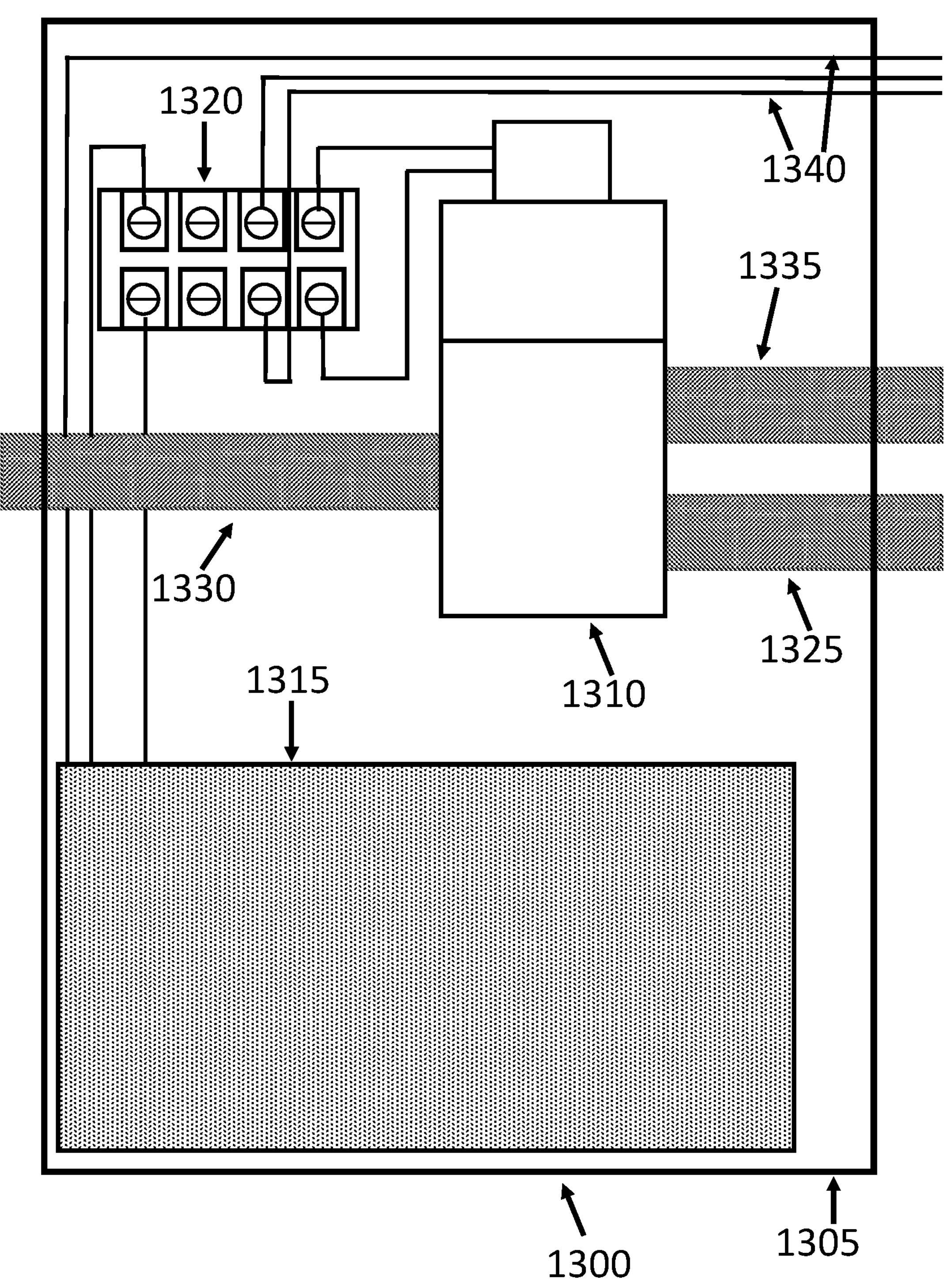
FIG. 13 illustrates the interior of a control box, according to an embodiment.

FIG. 13 illustrates a detailed interior view of a control box according to an embodiment. The control box 1300 may comprise a protective housing 1305 having a solenoid 1310, a battery 1315, and a switching mechanism 1320 housed therein. A first gas line 1325 extends through a first hole in housing 1305. A second gas line 1330 extends through a second hole in housing 1305. A third gas line 1335 extends through a third hole in housing 1305. The first line 1325 receives supply gas from a supply source, wherein the supply gas may be compressed gas such as natural gas. The second line 1330 provides supply gas to the dump valve. The third line 1335 provides for ventilation of the supply gas supplied to the dump valve. Wiring 1340 may be included to connect the electrical components and may enter or exit housing 1305 through one or more openings.

The switching mechanism 1320 is in electrical communication with an electric proximity switch located on a sensor head of a low voltage level controller as disclosed herein. The switching mechanism controls the solenoid 1310 to allow for the opening, closing, and ventilation of the dump valve. For example, when the proximity switch detects deflection of the torque tube, the switching mechanism activates the solenoid 1310 to allow fuel gas from the first line to flow through the second line and into the dump valve to open the dump valve. When the level in the vessel reaches the desired point, the proximity switch detects the change in the torque tube and provides a corresponding signal to the switching mechanism. The supply gas that was used to open the dump valve is then released through the third line. This provides a benefit over traditional solutions by allowing the gas used to open the dump valve to be released at a remote location, spaced apart from the sensor head.

The control box 1300 shown in FIG. 13 houses components for the operation of a single system that includes a single sensor head and a single dump valve. Accordingly, the components shown in FIG. 13 include a single solenoid 1310, a single first gas line 1325, a single second gas line 1330, and a single third gas line 1335. In an alternative embodiment described below, a control box may include components for the operation of two systems.

According to some embodiments, there is a 12-volt battery 1315 inside the control box 1300 and a solar panel electrically connected thereto (see FIG. 12). The solar panel may suitably charge the battery during the day to allow for continuous operation. It will be apparent to one of ordinary skill that the configuration of the protective housing and the internal components shown is exemplary. Components may be otherwise arranged or positioned and illustrated openings in the housing may be different in number or differently configured. It will be apparent to one of ordinary skill in the art that various configurations for the housing may be suitable.

Figure 14:
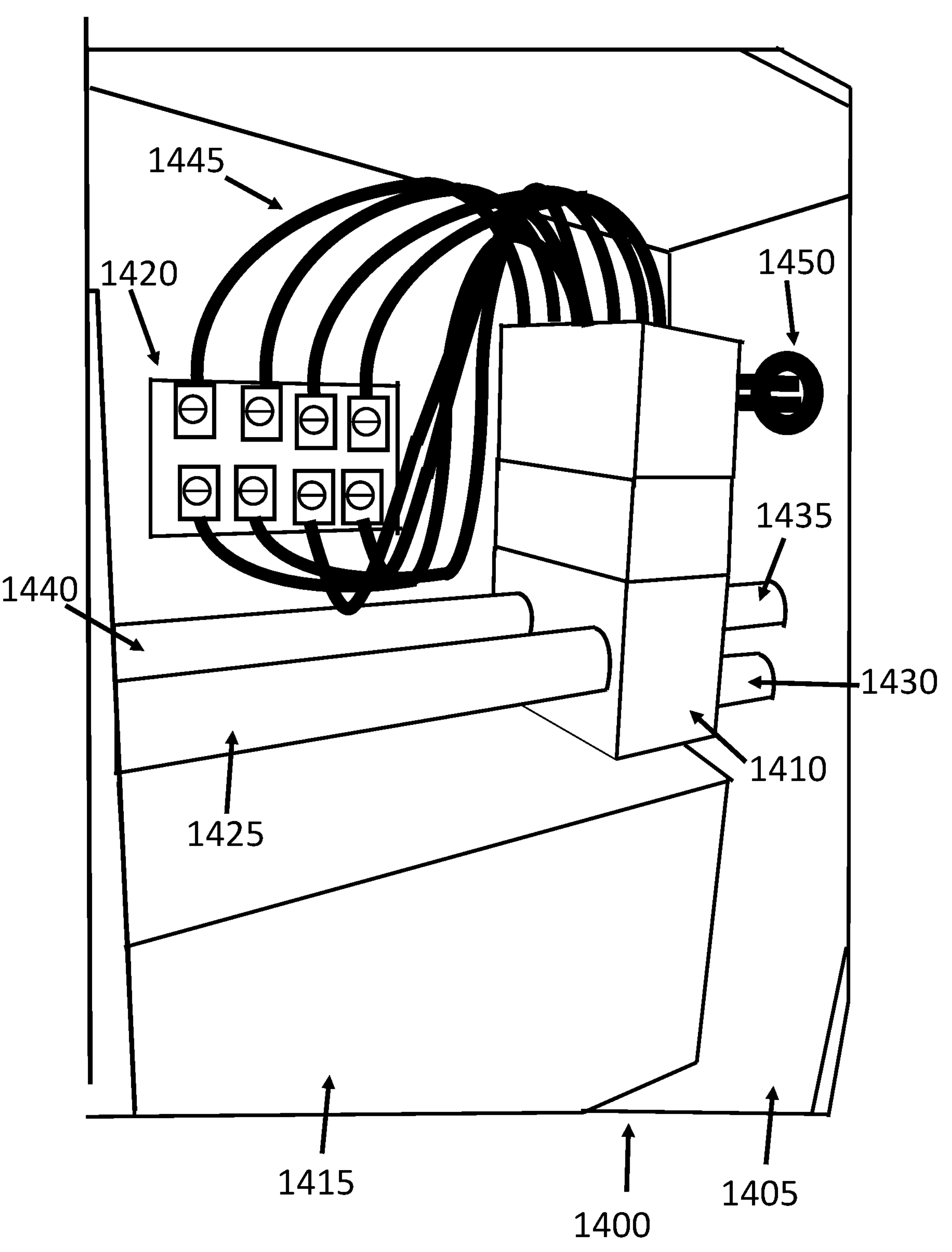
FIG. 14 illustrates a perspective view of the interior of a control box, according to an embodiment.

FIG. 14 illustrates a perspective view of the interior of a control box, according to an embodiment. The control box 1400 may comprise a protective housing 1405 having components for the operation of two systems (two separate sensor heads and dump valves on two separate production vessels), whereas control box 1300 shown in FIG. 13 houses components for the operation of a single system (a single sensor head, dump valve, and production vessel). The control box 1400, therefore, has two solenoids contained in 1410, a battery 1415, and a switching mechanism 1420 housed therein, such that the two solenoids 1410 and switching mechanism 1420 are in communication with two different sensor heads and two different dump valves in operation with two different production vessels. Likewise, control box 1400 has two sets of gas lines that enter and exit the control box, with supply gas through the lines controlled by the two solenoids housed in 1410.

In particular, a first gas line 1425 extends through a first hole in housing 1405. A second gas line 1430 extends through a second hole in housing 1405. A third gas line 1435 extends through a third hole in housing 1405. A fourth gas line 1440 extends through a fourth hole in housing 1405, adjacent to the first gas line 1425. A fifth gas line (not visible) extends through a fifth hole in housing 1405, adjacent to the second gas line 1430. A sixth gas line (not visible) extends through a sixth hole in housing 1405, adjacent to the third gas line 1435. The first and fourth lines 1425 and 1440 receive gas from a supply source. The second line 1430 and the fifth line provide supply gas supplied to two separate dump valves. The third line 1435 and the sixth line provide for ventilation of the supply gas supplied to the two separate dump valves. Wiring 1445 may be included to connect the electrical components and may enter or exit housing 1405 through one or more openings, such as opening 1450.

The switching mechanism 1420 is in electrical communication with electric proximity switches located on two separate sensor heads of a low-voltage level controller as disclosed herein. The switching mechanism controls the solenoids contained in 1410 to allow for the opening, closing, and ventilation of two separate dump valves. For example, when a first proximity switch detects deflection of the torque tube from a first production vessel, the switching mechanism activates the corresponding solenoid in 1410 to allow fuel gas from the first line 1425 through the second line 1430 and into the dump valve to open the dump valve. When the level in the vessel reaches the desired point, the proximity switch detects the change in the torque tube and provides a corresponding signal to the switching mechanism. The supply gas that was used to open the dump valve is then released through the third line 1435.

Likewise, when a second proximity switch detects deflection of the torque tube from a second production vessel, the switching mechanism activates the corresponding solenoid in 1410 to allow fuel gas from the fourth line 1440 through the fifth line and into the dump valve to open the dump valve. When the level in the vessel reaches the desired point, the proximity switch detects the change in the torque tube and provides a corresponding signal to the switching mechanism. The supply gas that was used to open the dump valve is then released through the sixth line.

While the systems described herein include a control box housing components for one or two systems, the low voltage level controllers described herein are not limited to control boxes for one or two systems. Accordingly, the low voltage level controllers described herein can be scaled up to an appropriate number of systems controlled within a particular control box for a particular, desired application.

Figure 15:
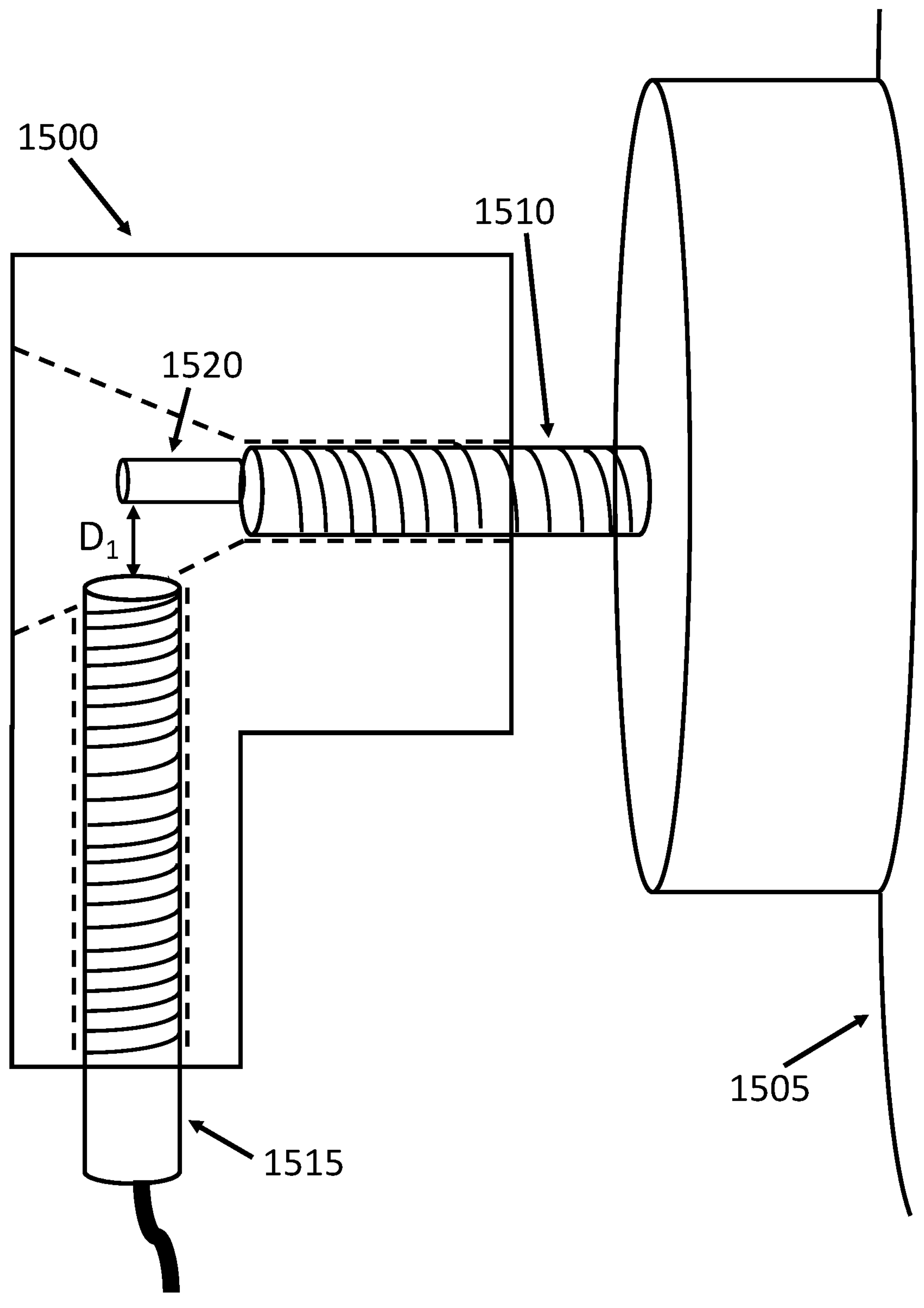
FIG. 15 illustrates a cross-sectional view of a low-voltage sensor head in an inactive state, according to an embodiment.

FIG. 15 illustrates a cross-sectional view of a low-voltage sensor head in an inactive state, according to an embodiment. As shown in FIG. 15, a low voltage sensor head 1500 is attached to a torque tube 1510 on a production vessel 1505. The low voltage sensor head 1500 contains a proximity or sensing switch 1515 that detects the deflection of a torque tube shaft or sensing rod 1520. In the inactive state, the liquid level in the production vessel is below a predetermined setting and the distance $D_1$ between the torque tube shaft 1520 and the proximity switch 1515 will not activate the proximity switch 1515.

Figure 16:
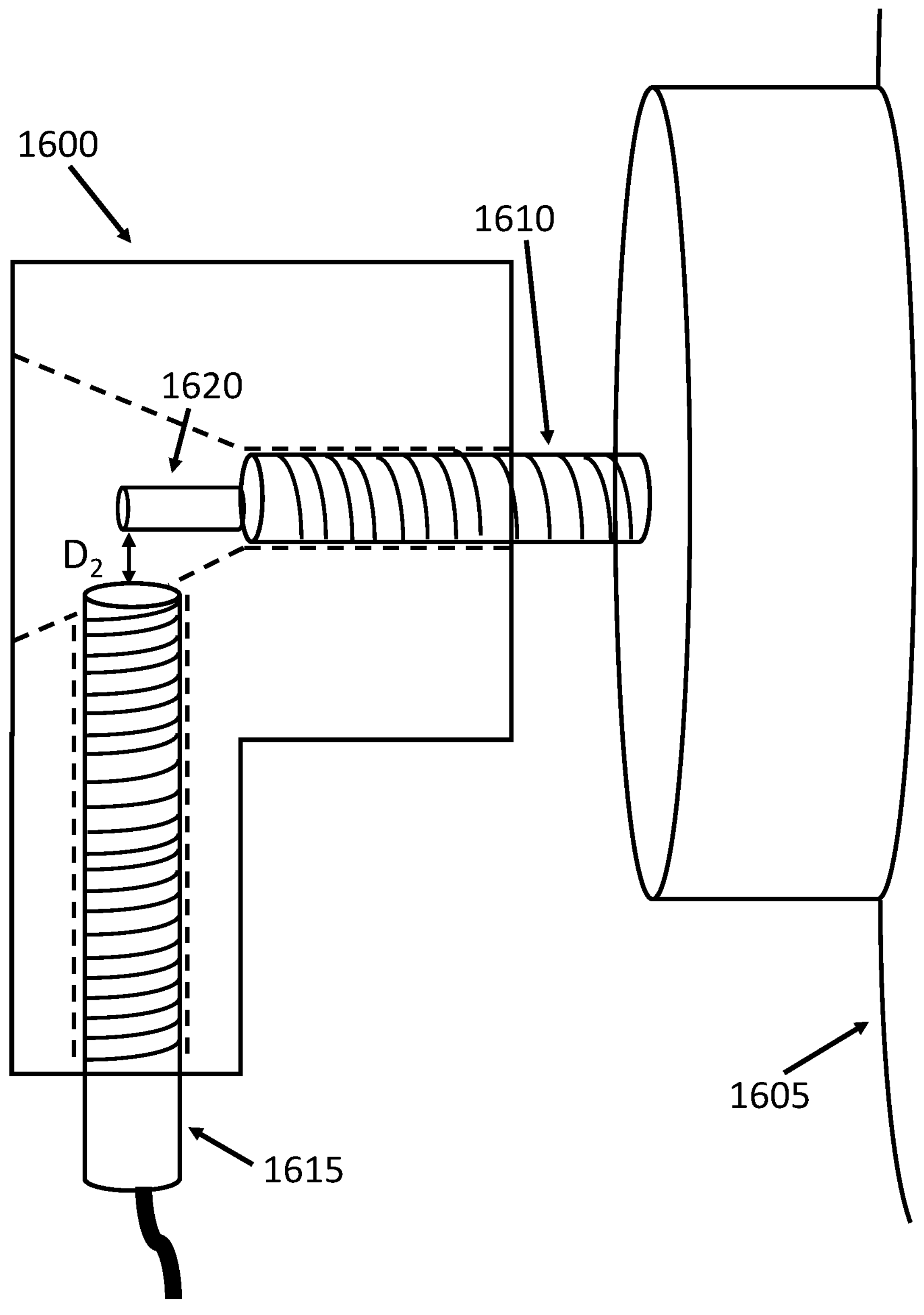
FIG. 16 illustrates a cross-sectional view of a low-voltage sensor head in an active state, according to an embodiment.

FIG. 16 illustrates a cross-sectional view of a low-voltage sensor head in an active state, according to an embodiment. As shown in FIG. 16, a low voltage sensor head 1600 is attached to a torque tube 1610 on a production vessel 1605. The low voltage sensor head 1600 contains a proximity or sensing switch 1615 that detects the deflection of a torque tube shaft or sensing rod 1620. In the active state, the liquid level in the production vessel is above a predetermined setting and the distance $D_2$ between the torque tube shaft 1620 and the proximity switch 1615 activates the proximity switch 1615. The activated proximity switch 1615 provides a signal to a control box, which in turn activates a dump valve to open and remove liquid from the production vessel 1605 until the proximity switch 1615 is deactivated (as shown in FIG. 15) when the liquid level in the production vessel 1605 reaches/falls below a predetermined threshold.

Figure 17:
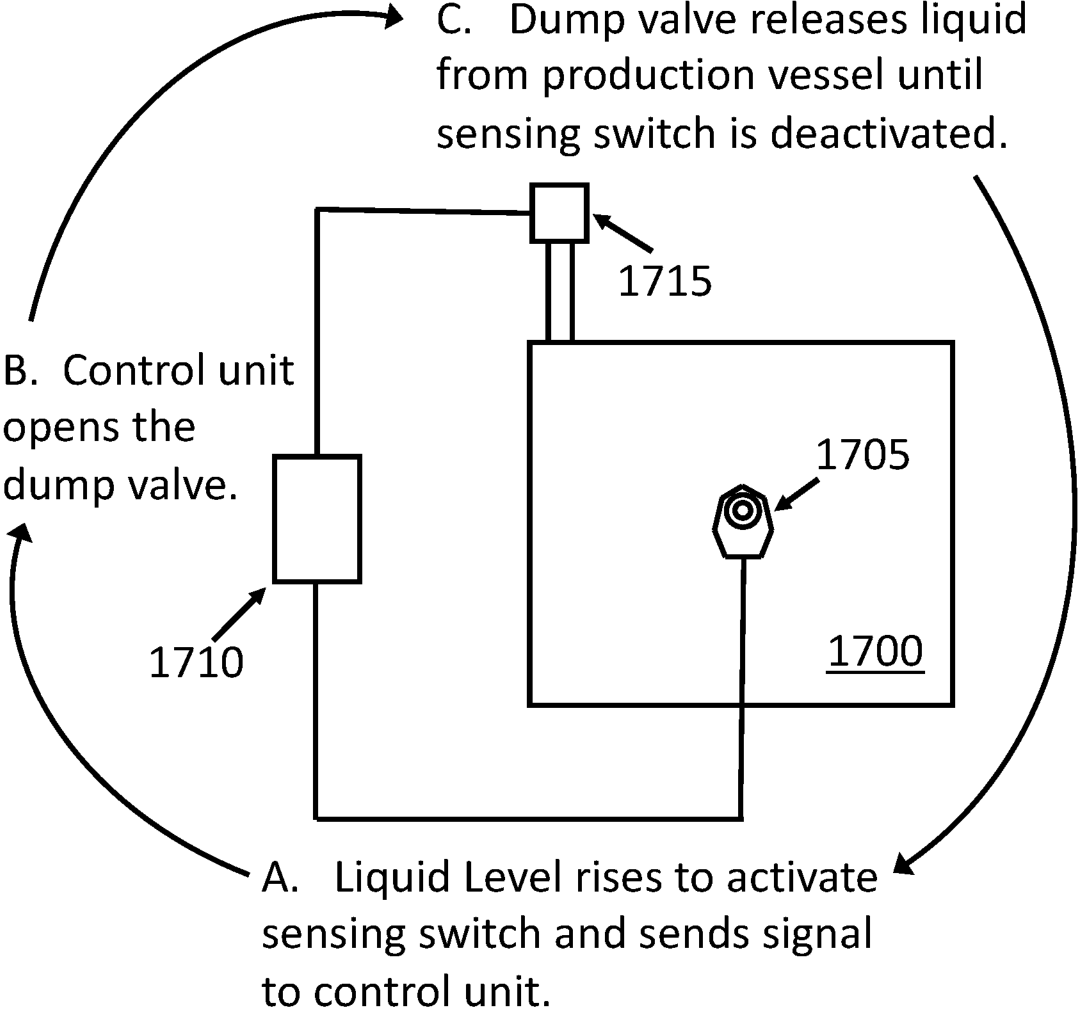
FIG. 17 illustrates a schematic diagram of a cycle of using a low-voltage sensor head, according to an embodiment.

FIG. 17 illustrates a schematic diagram of a cycle of using a low-voltage sensor head, according to an embodiment. At stage A, the liquid level in the production vessel 1700 rises until it reaches a predetermined level. At this point, the proximity or sensing switch in the sensor head 1705 is activated and sends a signal to control unit 1710. At stage B, control unit 1710 opens the dump valve 1715. At stage C, the dump valve releases liquid from the vessel until the liquid level reaches a predetermined threshold and the switch is deactivated, closing the dump valve.

According to some embodiments, the low voltage level controller is powered by a power supply that is remote to the sensor head. By locating the power supply and control box remotely to the sensor head, the power supply and control box components may be located entirely outside of environments designated by the EPA to pose high fire and electrical safety hazards. According to some embodiments, shielded wiring and conduit with junction boxes are used to assist with class 1 division 1 certification requirements.

Further, the components of the controller may be selected to provide unique low-voltage operation, remote power supply, cost-effectiveness, lack of emissions, and environmental impact. Controllers as disclosed herein product may be suitable for meeting even anticipated stricter future regulations from the EPA.

In some embodiments, the low voltage level controllers disclosed herein may be suitable for use with existing Wellmark and other traditional products. Controllers, as disclosed herein, may be retrofitted to replace existing pneumatic or high-voltage controllers, such as by replacing traditional controller heads and switches with the components disclosed herein to operate with traditional torque tubes and valves.

It will be understood that the controllers disclosed herein may be manufactured from a variety of materials. In one preferred embodiment, the sensor head is manufactured using plastic, polymer, or composite material. Such material may provide benefits in terms of cost, effectiveness, and reliability. A sensor head may be produced by any methods commonly used with such materials, such as, but not limited to, three-dimensional printing, injection molding, and so forth.

A feature illustrated in one of the figures may be the same as or similar to a feature illustrated in another of the figures. Similarly, a feature described in connection with one of the figures may be the same as or similar to a feature described in connection with another of the figures. The same or similar features may be noted by the same or similar reference characters unless expressly described otherwise. Additionally, the description of a particular figure may refer to a feature not shown in the particular figure. The feature may be illustrated in and/or further described in connection with another figure.

Elements of processes (i.e., methods) described herein may be executed in one or more ways such as by a human, by a processing device, by mechanisms operating automatically or under human control, and so forth. Additionally, although various elements of a process may be depicted in the figures in a particular order, the elements of the process may be performed in one or more different orders without departing from the substance and spirit of the disclosure herein.

The foregoing description sets forth numerous specific details such as examples of specific systems, components, methods, and so forth, to provide a good understanding of several implementations. It will be apparent to one skilled in the art, however, that at least some implementations may be practiced without these specific details. In other instances, well-known components or methods are not described in detail or are presented in simple block diagram format to avoid unnecessarily obscuring the present implementations. Thus, the specific details set forth above are merely exemplary. Particular implementations may vary from these exemplary details and still be contemplated to be within the scope of the present implementations.

Related elements in the examples and/or embodiments described herein may be identical, similar, or dissimilar in different examples. For the sake of brevity and clarity, related elements may not be redundantly explained. Instead, the use of same, similar, and/or related element names and/or reference characters may cue the reader that an element with a given name and/or associated reference character may be similar to another related element with the same, similar, and/or related element name and/or reference character in an example explained elsewhere herein. Elements specific to a given example may be described regarding that particular example. A person having ordinary skill in the art will understand that a given element need not be the same and/or similar to the specific portrayal of a related element in any given figure or example to share features of the related element.

It is to be understood that the foregoing description is intended to be illustrative and not restrictive. Many other implementations will be apparent to those of skill in the art upon reading and understanding the above description. The scope of the present implementations should, therefore, be determined with reference to the appended claims, along with the full scope of equivalents to which such claims are entitled.

The foregoing disclosure encompasses multiple distinct examples with independent utility. While these examples have been disclosed in a particular form, the specific examples disclosed and illustrated above are not to be considered in a limiting sense as numerous variations are possible. The subject matter disclosed herein includes novel and non-obvious combinations and sub-combinations of the various elements, features, functions and/or properties disclosed above both explicitly and inherently. Where the disclosure or subsequently filed claims recite "a" element, "a first" element, or any such equivalent term, the disclosure or claims is to be understood to incorporate one or more such elements, neither requiring nor excluding two or more of such elements.

As used herein "same" means sharing all features and "similar" means sharing a substantial number of features or sharing materially important features even if a substantial number of features are not shared. As used herein "may" should be interpreted in a permissive sense and should not be interpreted in an indefinite sense. Additionally, use of "is" regarding examples, elements, and/or features should be interpreted to be definite only regarding a specific example and should not be interpreted as definite regarding every example. Furthermore, references to "the disclosure" and/or "this disclosure" refer to the entirety of the writings of this document and the entirety of the accompanying illustrations, which extends to all the writings of each subsection of this document, including the Title, Background, Brief description of the Drawings, Detailed Description, Claims, Abstract, and any other document and/or resource incorporated herein by reference.

As used herein regarding a list, "and" forms a group inclusive of all the listed elements. For example, an example described as including A, B, C, and D is an example that includes A, includes B, includes C, and also includes D. As used herein regarding a list, "or" forms a list of elements, any of which may be included. For example, an example described as including A, B, C, or D is an example that includes any of the elements A, B, C, and D. Unless otherwise stated, an example including a list of alternatively-inclusive elements does not preclude other examples that include various combinations of some or all of the alternatively-inclusive elements. An example described using a list of alternatively-inclusive elements includes at least one element of the listed elements. However, an example described using a list of alternatively-inclusive elements does not preclude another example that includes all of the listed elements. And, an example described using a list of alternatively-inclusive elements does not preclude another example that includes a combination of some of the listed elements. As used herein regarding a list, "and/or" forms a list of elements inclusive alone or in any combination. For example, an example described as including A, B, C, and/or D is an example that may include: A alone; A and B; A, B and C; A, B, C, and D; and so forth. The bounds of an "and/or" list are defined by the complete set of combinations and permutations for the list.

Where multiples of a particular element are shown in a FIG., and where it is clear that the element is duplicated throughout the FIG., only one label may be provided for the element, despite multiple instances of the element being present in the FIG. Accordingly, other instances in the FIG. of the element having identical or similar structure and/or function may not have been redundantly labeled. A person having ordinary skill in the art will recognize based on the disclosure herein redundant and/or duplicated elements of the same FIG. Despite this, redundant labeling may be included where helpful in clarifying the structure of the depicted examples.

The Applicant(s) reserves the right to submit claims directed to combinations and sub-combinations of the disclosed examples that are believed to be novel and non-obvious. Examples embodied in other combinations and sub-combinations of features, functions, elements and/or properties may be claimed through amendment of those claims or presentation of new claims in the present application or in a related application. Such amended or new claims, whether they are directed to the same example or a different example and whether they are different, broader, narrower or equal in scope to the original claims, are to be considered within the subject matter of the examples described herein.

The invention claimed is:

1. A system, comprising:

a vessel having a torque tube assembly;

a low voltage level controller comprising a sensor head removably attached to the torque tube assembly;

the sensor head comprising a first aperture positioned horizontally in the sensor head and extending from a front side of the sensor head to a rear side of the sensor head, the first aperture having a front portion circumscribed by a connection location and a rear portion configured to attach to a torque tube assembly;

the sensor head comprising a second aperture positioned vertically in the sensor head and extending from a bottom side of the sensor head to the connection location of the first aperture, the second aperture configured to receive a proximity sensing switch;

the low voltage level controller further comprising a proximity sensing switch positioned in the second aperture of the sensor head and configured to detect a torque tube sensing rod that protrudes from the torque tube assembly into the connection location of the first aperture of the sensor head;

the low voltage level controller further comprising a control box located remotely to the sensor head, the control box comprising a solenoid; a fuel gas supply line; a dump valve line; a fuel gas ventilation line; a switching mechanism in electrical communication with the proximity sensing switch; and a battery in electrical communication with the switching mechanism and the proximity sensing switch;

wherein the solenoid controls flow of fuel gas from the fuel gas supply line into the dump valve line and release of fuel gas from the dump valve line into the fuel gas ventilation line; and the system further comprising a remotely located dump valve on the vessel, the dump valve in fluid connection with the dump valve line.

2. The system of claim 1, further comprising an external solar panel power supply in electrical communication with the switching mechanism and the proximity sensing switch to provide power to the switching mechanism and the proximity sensing switch.

3. The system of claim 1, further comprising an external solar panel power supply in electrical communication with the battery to provide power for charging the battery.

4. The system of claim 1, wherein the connection location of the first aperture of the sensor head is in a shape of a cylinder, wherein a first end of the cylinder forms an opening at the front side of the sensor head and a second end of the cylinder surrounds the rear portion of the first aperture that attaches to the torque tube assembly.

5. The system of claim 1, wherein the connection location of the first aperture has a conical shape, wherein a first end of the conical shape forms an opening at the front side of the sensor head and a second end of the conical shape surrounds the rear portion of the first aperture that attaches to the torque tube assembly, such that the conical shape flares outward from the rear portion of the first aperture to the front side of the sensor head.

6. The system of claim 1, wherein the sensor head comprises a front portion and a rear portion;

the front portion having a top section and a bottom section, wherein the top section of the front portion contains the connection location of the first, horizontal aperture and the bottom section of the front portion contains the second, vertical aperture; and wherein the rear portion of the sensor head projects rearward from the top section of the front portion of the sensor head and contains the rear portion of the first, horizontal aperture that attaches to the torque tube assembly.

7. The system of claim 6, wherein the front portion of the sensor head has exterior side panels that form a polygonal shape and the rear portion of the sensor head has exterior side panels that form a hexagonal shape that projects rearward from the front portion of the sensor head and contain the rear portion of the first aperture that attaches to the torque tube assembly.

8. The system of claim 7, wherein the front portion of the sensor head has exterior side panels that form a heptagon shape comprising:

a first bottom panel, a first lower panel positioned at a first side of the bottom panel and a second lower panel positioned at a second, opposite side of the bottom panel;

a first upper panel positioned above the first lower panel and a second upper panel positioned above the second lower panel; and a first top panel positioned above the first upper panel and a second top panel positioned above the second upper panel, wherein the first top panel and second top panel meet to form an apex of the heptagon.

9. A device, comprising:

a sensor head having a first aperture configured to attach to a torque tube of a vessel;

the sensor head having a proximity switch positioned within a second aperture of the sensor head, wherein the proximity switch is configured to detect deflection of the torque tube;

a control box having a solenoid;

a fuel gas supply line;

a dump valve line;

a fuel gas ventilation line; and a switching mechanism in electrical communication with the proximity switch;

the fuel gas supply line, the dump valve line, and the fuel gas ventilation line each being in sealable fluid connection with the solenoid; and a battery in electrical connection with an external power supply, the proximity switch, and the switching mechanism.

10. The device of claim 9, further comprising:

a second sensor head having a first aperture configured to attach to a torque tube of a vessel;

the second sensor head having a second proximity switch positioned within a second aperture of the sensor head, wherein the second proximity switch can detect deflection of the torque tube;

the control box having a second solenoid; a second fuel gas supply line; a second dump valve line; a second fuel gas ventilation line;

wherein the switching mechanism is in electrical communication with the second proximity switch; and the second fuel gas supply line, the second dump valve line, and the second fuel gas ventilation line each being in sealable fluid connection with the second solenoid.

11. The device of claim 9, wherein the sensor head comprises a front portion and a rear portion;

the front portion of the sensor head having a top section and a bottom section, wherein the top section of the front portion of the sensor head contains a front portion of the first aperture and the bottom section of the front portion contains the second aperture; and wherein the rear portion of the sensor head projects rearward from the top section of the front portion of the sensor head and contains a rear portion of the first aperture that attaches to the torque tube.

12. The device of claim 9, wherein the switching mechanism in electrical communication with the proximity switch is configured to respond to a signal delivered by the proximity switch in response to deflection of a sensing rod that projects from the torque tube;

wherein the switching mechanism responds to an activation signal delivered by the proximity switch to activate the solenoid to allow fuel gas from the first line to flow through the second line into the dump valve line to open a dump valve in communication with the dump valve line; and wherein the switching mechanism responds to a deactivation signal delivered by the proximity switch to direct the solenoid to allow fuel gas supplied to the dump valve line to be released through the fuel gas ventilation line.

13. The device of claim 9, further comprising an external solar panel power supply in electrical communication with the battery to provide power for charging the battery.

14. The device of claim 9, wherein a portion of the first aperture of the sensor head configured to attach to a torque tube of a vessel is cylindrically shaped and threaded for attachment to a threaded torque tube; and wherein the second aperture of the sensor head is cylindrically shaped and threaded to receive a threaded proximity switch.

* * * * *